(12) United States Patent
Hu et al.

(10) Patent No.: US 11,076,235 B2
(45) Date of Patent: Jul. 27, 2021

(54) SPEAKER ASSEMBLY

(71) Applicant: AAC Technologies Pte. Ltd., Singapore (SG)

(72) Inventors: Hongjian Hu, Shenzhen (CN); Siyuan Ni, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/524,186

(22) Filed: Jul. 29, 2019

(65) Prior Publication Data
US 2020/0045459 A1    Feb. 6, 2020

(30) Foreign Application Priority Data

Aug. 3, 2018    (CN) .......................... 201821245460.0

(51) Int. Cl.
| | | |
|---|---|---|
| *H04R 25/00* | (2006.01) | |
| *H04R 9/06* | (2006.01) | |
| *H05K 1/02* | (2006.01) | |
| *H05K 1/18* | (2006.01) | |
| *H04R 1/06* | (2006.01) | |
| *H04R 7/12* | (2006.01) | |
| *H04R 9/02* | (2006.01) | |
| *H04R 7/18* | (2006.01) | |

(52) U.S. Cl.
CPC ................. *H04R 9/06* (2013.01); *H04R 1/06* (2013.01); *H04R 7/127* (2013.01); *H04R 9/025* (2013.01); *H05K 1/0277* (2013.01); *H05K 1/18* (2013.01); *H04R 7/18* (2013.01); *H04R 2400/11* (2013.01); *H05K 2201/10083* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,840,025 | B2 * | 11/2010 | Ikeda ........................ | H04R 9/04 381/404 |
| 8,794,374 | B2 * | 8/2014 | Kim ........................ | H04R 9/041 181/166 |

* cited by examiner

*Primary Examiner* — Amir H Etesam
(74) *Attorney, Agent, or Firm* — W&G Law Group LLP

(57) ABSTRACT

The present disclosure provides a speaker assembly. The speaker assembly includes: a frame, a magnetic circuit system, a vibration system, and a flexible circuit board. The flexible circuit board includes a first mounting portion, a second mounting portion spaced from the first mounting portion for being fixed to the frame, and a pair of elastic arms. Each elastic arm includes a first fixing end connected to the first mounting portion, a first connecting arm extending from the first fixing portion, a second fixing end connected to the second mounting portion, a second connecting arm extending from the second fixing end, and a connecting portion connecting the first connecting arm to the second connecting arm. The two connecting portions of the two elastic arms are connected with each other at the corresponding portions.

5 Claims, 3 Drawing Sheets

SPEAKER ASSEMBLY

FIELD OF THE PRESENT DISCLOSURE

The present disclosure relates to the field of electromagnetic transducers, more particularly to a speaker assembly used in a portable electronic device. Further, the present disclosure relates to a flexible printed circuit board used in the speaker assembly.

DESCRIPTION OF RELATED ART

In a related art, a flexible printed circuit board, used in a speaker assembly, includes a pair of first mounting portions and a pair of connecting portions respectively extending from the two mounting portions, and a pair of second mounting portions extending from the connecting portions. The connecting portions are spaced apart from each other, i.e., the two connecting portions are not connected with each other. Such a configuration will cause resonance vibration when the flexible printed circuit board is used in a speaker assembly.

Therefore, an improved speaker assembly is needed to solve the problem mentioned above. Accordingly, an improved flexible printed circuit board is also needed.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

Figure 1:
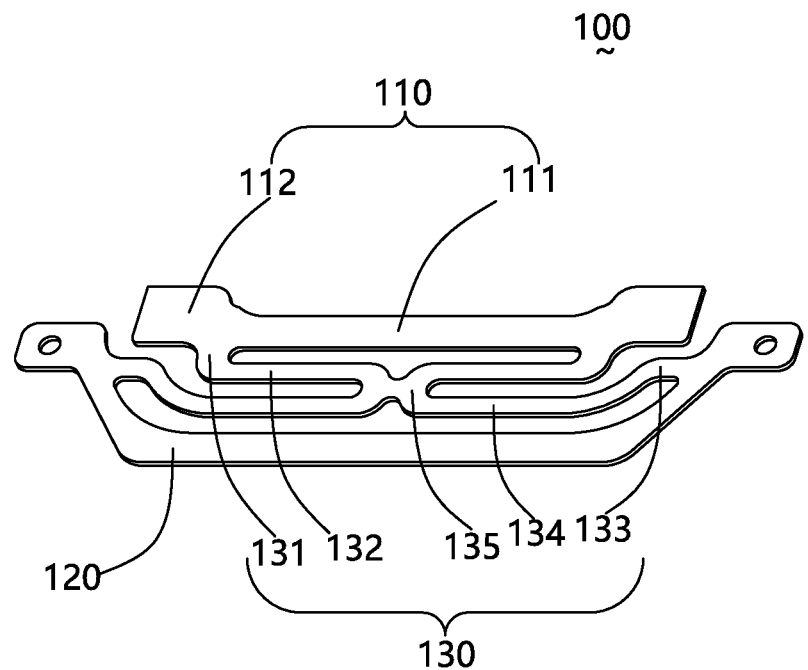
FIG. 1 is an isometric view of a flexible printed circuit board of a speaker assembly in accordance with an exemplary embodiment of the present disclosure.

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby are only to explain the disclosure, not intended to limit the disclosure.

An aspect of the present disclosure reflects to a flexible circuit board 100. The flexible circuit board 100 includes a first mounting portion 110, a second mounting portion 120 spaced apart from the first mounting portion 110, and an elastic arm 130 for connecting the first mounting portion 110 to the second mounting portion 120. The elastic arm 130 includes a pair of elastic arms with the same structures. Each of the elastic arm 130 includes a first fixing end 131 connecting to the first mounting portion, a first connecting arm 132 extending from the first fixing end 131, a second fixing end 133 connecting to the second mounting portion 120, a second connecting arm 134 extending from the second fixing end 133, and a connecting portion 135 for connecting the first connecting arm 132 to the second connecting arm 134. Two connecting portions 13 of the two elastic arms 130 are connected with each other at the corresponding portions. The first connecting arm 132 is parallel to the second connecting arm 134. The flexible circuit board 100 is a symmetrical structure, and the connecting portion 135 locates at an axis of symmetry of the flexible circuit board 100.

In the embodiment, two connecting portions 13 of the two elastic arms 130 are connected with each other at the corresponding portions, which can effectively reduce the resonance vibration of the flexible circuit board 100, and further improves the vibration-acoustic performance of the speaker assembly, improves the manufacturing quality, thereby improving the user's experiences.

Another aspect of the present disclosure reflects to a speaker assembly 200. The speaker assembly 200 includes a frame 210, a magnetic circuit system 200 accommodated in the frame 210, a vibration system 230 in the frame 210, and a flexible circuit board 100. The flexible circuit board 100 has the configuration described above. As described above, the two connecting portions 13 of the two elastic arms 130 are connected with each other at the corresponding portions, which can effectively reduce the resonance vibration of the flexible circuit board 100, and further improves the vibration-acoustic performance of the speaker assembly, improves the manufacturing quality, thereby improving the user's experiences.

Figure 3:
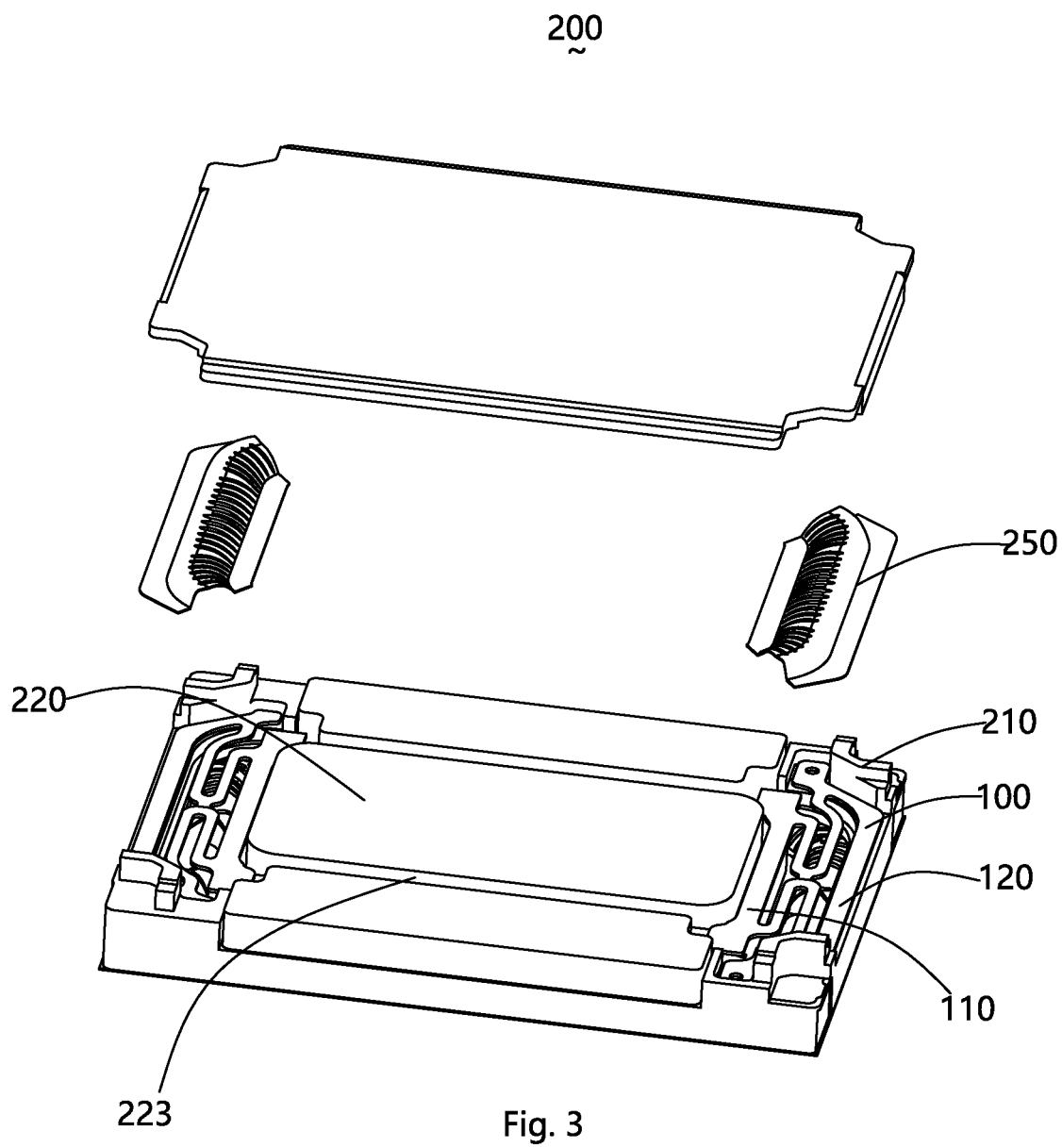
FIG. 3 is a partially exploded view of the speaker assembly.

In detail, referring to FIG. 3, the first mounting portion 110 of the flexible circuit board 100 is fixed to the vibration system 230, and the second mounting portion 120 is fixed to the frame 210. A pair of flexible circuit boards 100 is provided, and each of the flexible circuit boards is arranged along a short axis of the speaker assembly.

Figure 4:
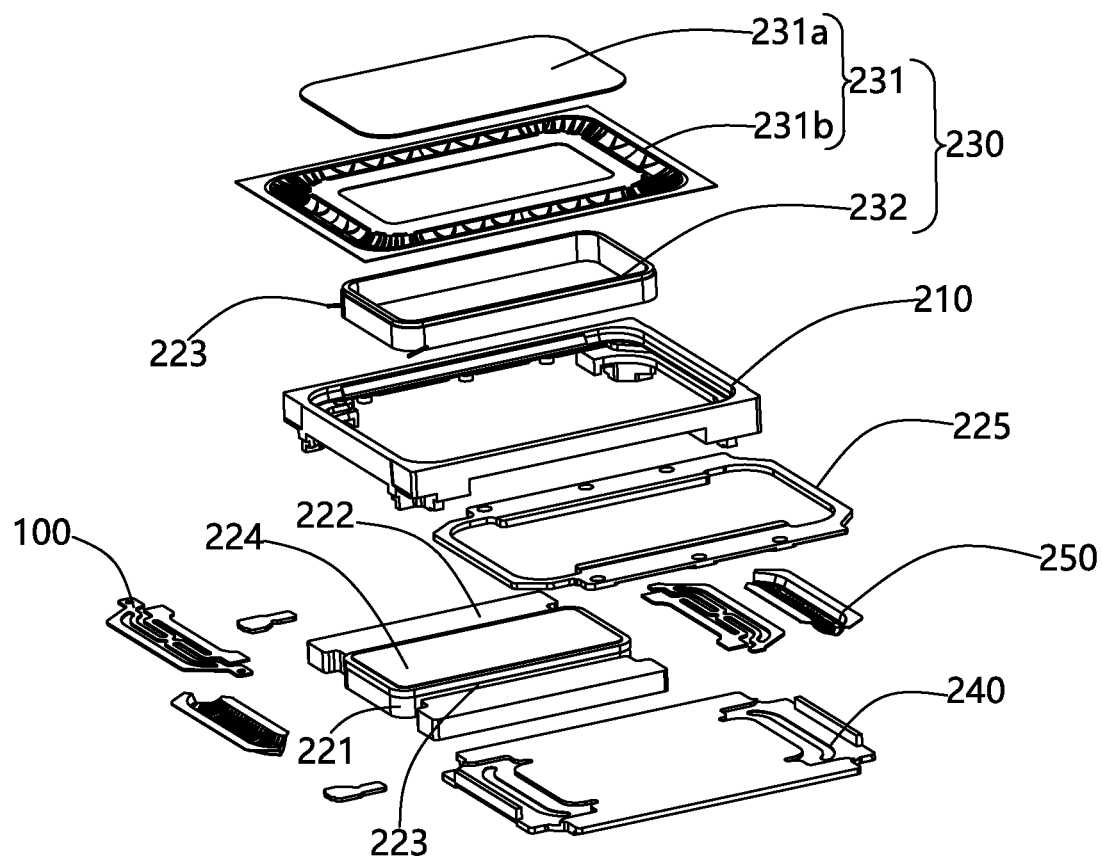
FIG. 4 is an exploded view of the speaker assembly.
Figure 5:
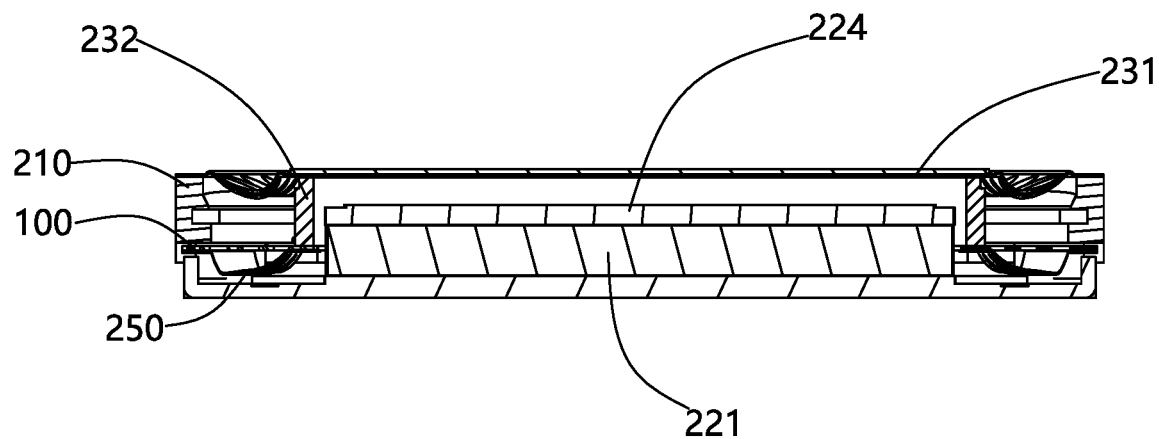
FIG. 5 is a cross-sectional view of the speaker assembly, taken along line A-A in FIG. 2.

Referring to FIGS. 3-5, the vibration system 230 includes a diaphragm 231 and a voice coil 232 for driving the diaphragm 231 to generate sound. The voice coil 232 is connected to the first mounting portion 110. The diaphragm 231 faces the voice coil 232. The first mounting portion 110 of the flexible circuit board 100 includes a supporting portion 111 for supporting the voice coil 232, and a pair of soldering portion 112 extending from two ends of the supporting portion 111. The voice coil 232 includes lead wire 233 for being soldered with the soldering portion 112. The supporting portion 111 is parallel to the first connecting arm 132 and the second connecting arm 134.

Figure 2:
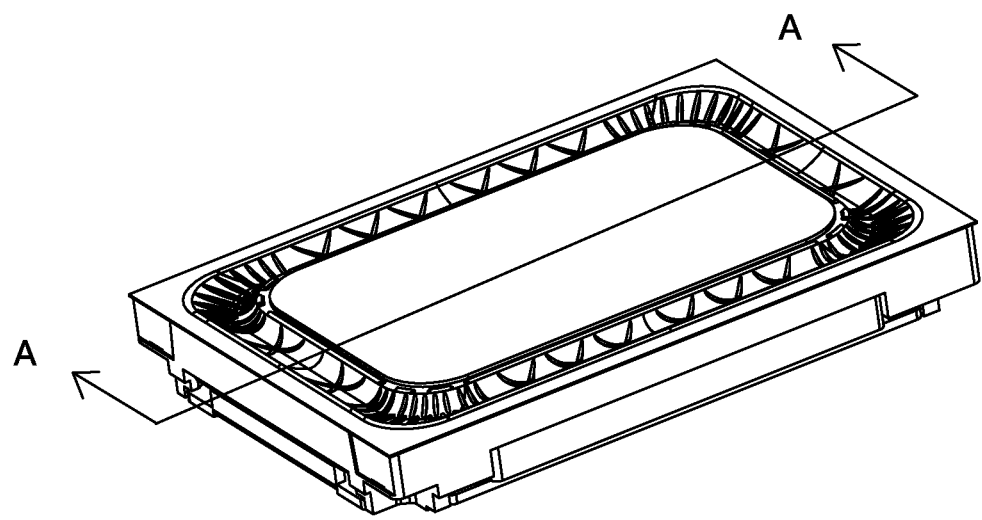
FIG. 2 is isometric view of the speaker assembly of the present disclosure.

Referring to FIGS. 2-3, the diaphragm 231 includes a dome 231a and a suspension 231b surrounding the dome 231a.

The magnetic circuit system 220 includes a main magnet 221 and an auxiliary magnet 222 adjacent to the main magnet 221 for forming a magnetic gap 223 therebetween for at least partially receive the voice coil 232. The magnetic circuit system 220 further includes a pole plate 224 covering the main magnet 221 and an upper plate 225 covering the auxiliary magnet 222.

The speaker assembly 200 further includes a magnetic yoke 240 for carrying the magnetic circuit system 220, a diaphragm 250 sandwiched between the magnetic yoke 240 and the flexible circuit board 100. One end of the diaphragm 250 is connected to the first mounting portion 110, and the other end is connected to the second mounting portion 120 of the flexible circuit board 100.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A speaker assembly, including:
   a frame;
   a magnetic circuit system in the frame;
   a vibration system in the frame, the vibration system including a diaphragm and a voice coil for driving the diaphragm;
   a flexible circuit board including a first mounting portion fixed to the vibration system, a second mounting portion spaced from the first mounting portion for being fixed to the frame, and a pair of elastic arms for connecting the first mounting portion to the second mounting portion; wherein
   each elastic arm includes a first fixing end connected to the first mounting portion, a first connecting arm extending from the first fixing portion, a second fixing end connected to the second mounting portion, a second connecting arm extending from the second fixing end, and a connecting portion connecting the first connecting arm to the second connecting arm, the flexible circuit board is a symmetrical structure, and the connecting portion locates at an axis of symmetry of the flexible circuit board;
   the two connecting portions of the two elastic arms are connected with each other at the corresponding portions, the first mounting portion of the flexible circuit board includes a supporting portion for supporting the voice coil, and a pair of soldering portion extending from two ends of the supporting portion; the voice coil includes a lead wire for being soldered with the soldering portion.

2. The speaker assembly as described in claim 1, wherein the first connecting arm is parallel to the second connecting arm.

3. The speaker assembly as described in claim 1, wherein the supporting portion is parallel to the first connecting arm and the second connecting arm.

4. The speaker assembly as described in claim 1 comprising a pair of flexible circuit boards each arranged along a short axis of the speaker assembly.

5. The speaker assembly as described in claim 1, wherein magnetic circuit system includes a main magnet and an auxiliary magnet adjacent to the main magnet for forming a magnetic gap therebetween, and the voice coil partially inserts into the magnetic gap.

* * * * *